United States Patent
Serebryanov (10) Patent No.: US 9,766,275 B2
(45) Date of Patent: Sep. 19, 2017

(54) METHODS AND APPARATUS FOR INCREASING ACCURACY OF RMS MEASUREMENTS OF SIGNALS WITH A HIGH CREST FACTOR

(71) Applicant: APPLIED MATERIALS, INC., Santa Clara, CA (US)

(72) Inventor: Oleg Serebryanov, San Jose, CA (US)

(73) Assignee: APPLIED MATERIALS, INC., Santa Clara, CA (US)

(*) Notice: Subject to any disclaimer, the term of this patent is extended or adjusted under 35 U.S.C. 154(b) by 445 days.

(21) Appl. No.: 14/278,621

(22) Filed: May 15, 2014

(65) Prior Publication Data
US 2014/0355972 A1 Dec. 4, 2014

Related U.S. Application Data

(60) Provisional application No. 61/830,901, filed on Jun. 4, 2013.

(51) Int. Cl.
*H05B 1/02* (2006.01)
*H01L 21/67* (2006.01)
*G01R 19/02* (2006.01)

(52) U.S. Cl.
CPC ........... *G01R 19/02* (2013.01); *H05B 1/0233* (2013.01); *H01L 21/67115* (2013.01)

(58) Field of Classification Search
CPC ......... H01L 21/67115; H01L 21/67248; C23C 16/00; G01R 19/02
See application file for complete search history.

(56) References Cited

U.S. PATENT DOCUMENTS

| | | | | |
|---|---|---|---|---|
| 5,937,142 A | * | 8/1999 | Moslehi | C23C 16/481 118/725 |
| 2005/0078848 A1 | * | 4/2005 | Hlibowicki | H03F 3/2171 381/401 |
| 2008/0091374 A1 | * | 4/2008 | Wang | G01Q 60/32 702/104 |
| 2009/0243582 A1 | * | 10/2009 | Irissou | H05B 39/08 323/320 |

* cited by examiner

*Primary Examiner* — Brian Jennison
(74) *Attorney, Agent, or Firm* — Moser Taboada; Alan Taboada (57) ABSTRACT

Methods and apparatus for determining the root-mean-square (RMS) voltage of an input voltage are provided herein. In some embodiments, an apparatus for determining the root-mean-square (RMS) voltage of an input voltage includes an amplifier to modify an amplitude of the input voltage signal; an amplitude detector, coupled to the amplifier, to transform the spectrum of the modified input voltage signal so that an increased portion of the signal is disposed within a desired frequency region; and a root-mean-square (RMS) converter, coupled to the amplitude detector, to determine the RMS voltage of the transformed input voltage signal, wherein a bandwidth of the RMS converter includes the desired frequency region.

20 Claims, 6 Drawing Sheets

METHODS AND APPARATUS FOR INCREASING ACCURACY OF RMS MEASUREMENTS OF SIGNALS WITH A HIGH CREST FACTOR

CROSS-REFERENCE TO RELATED APPLICATIONS

This application claims benefit of U.S. provisional patent application Ser. No. 61/830,901, filed Jun. 4, 2013, which is herein incorporated by reference.

FIELD

Embodiments of the present disclosure generally relate to substrate processing systems using lamps to provide thermal energy, and more specifically, to an apparatus for increasing accuracy of root-mean-square measurement for signals with a high crest factor for use in such substrate processing systems.

BACKGROUND

When measuring the voltage of a signal output from a lamp driver of a substrate process chamber, it is useful to compare the voltage of the signal output to the heat generated by lamps driven by the lamp driver. One common measurement used to analyze the voltage signal is the "peak voltage", which is defined as the maximum magnitude of the voltage signal.

However, it is often more useful to represent a time-varying voltage signal by an average value that would correspond to an equivalent direct current (DC) voltage, where the corresponding DC current determines the energy loss or dissipated heat caused by applying a voltage across a resistor. A simple arithmetic average of the voltage over time is typically not useful because time varying signals, such as an alternating current (AC) signal in which the voltage varies sinusoidally between positive and negative values, often have an average voltage over time of approximately zero. A more useful value to represent the time varying voltage is the root mean square ("RMS") value, which is the square root of the integral of the square of the voltage over time. The ratio of the peak voltage to the RMS voltage of a signal is known as the crest factor. Devices which determine RMS voltage of lamp drivers are known as RMS converters.

Error, in the context of RMS measurement, is defined by ignored energy of a measured signal due to the limiting dynamic range or spectrum of the measured signal. The inventors have observed that conventional RMS converters used in commercially available RMS voltmeters have low accuracy when used with signals having a high crest factor. For example, some conventional RMS meters have an approximate 4% error at a crest factor of 4. The error depends on the dynamic range and spectrum of a measured signal. However, the crest factor of pulse width modulated (PWM) signals, widely used in motor controllers and switching mode power supplies can be greater than 30. Therefore, measurements made by commonly used RMS meters give unacceptable results for PWM signals with a high crest factor.

Therefore, the inventors have provided methods and apparatus for providing more accurate RMS measurements of AC voltage signals generated by a lamp driver.

SUMMARY

Methods and apparatus for determining the root-mean-square (RMS) voltage of an input voltage are provided herein. In some embodiments, an apparatus for determining the root-mean-square (RMS) voltage of an input voltage includes an amplifier to modify an amplitude of the input voltage signal; an amplitude detector, coupled to the amplifier, to transform the spectrum of the modified input voltage signal so that an increased portion of the signal is disposed within a desired frequency region; and a root-mean-square (RMS) converter, coupled to the amplitude detector, to determine the RMS voltage of the transformed input voltage signal, wherein a bandwidth of the RMS converter includes the desired frequency region.

In some embodiments, a method for determining the root-mean-square (RMS) voltage of an input voltage includes modifying, using an amplifier, an amplitude of the input voltage signal; transforming the spectrum of the modified input voltage signal so that an increased portion of energy of the input voltage signal is disposed in a desired frequency region; and determining, using an RMS converter, the RMS voltage of the transformed input voltage signal, wherein a bandwidth of the RMS converter includes the desired frequency region.

In some embodiments, a substrate processing apparatus may include a process chamber, a lamp array configured to provide heat to the process chamber, a lamp driver that delivers stepped-down power to the lamp array, a power source electrically coupled to the lamp driver to deliver power to the lamp driver, a controller communicatively coupled to the lamp driver to control operation of the lamp driver, and a measuring system coupled to an output voltage of the lamp driver and configured to provide root-mean-square (RMS) voltage information to the controller to control the lamp driver, the measuring system including an amplifier to modify an amplitude of an input voltage signal provided by the lamp driver, an amplitude detector, coupled to the amplifier, to transform a spectrum of the modified input voltage signal so that an increased portion of the input voltage signal is disposed within a desired frequency region, and a root-mean-square (RMS) converter, coupled to the amplitude detector, to determine the RMS voltage of the input voltage signal, wherein a bandwidth of the RMS converter includes the desired frequency region.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of the present disclosure relate to methods and apparatus for increasing accuracy of root-mean-square (RMS) voltage measurements of a voltage signal with a high crest factor, for example, greater than 5, such as the voltage signal output from a lamp driver in a substrate processing chamber. In some embodiments, the apparatus includes a measurement system that comprises a front-end amplifier to convert a measured voltage to a range acceptable by an RMS converter, coupled to an amplitude detector to transform the spectrum of the input voltage signal where the energy of the signal is focused in low frequency regions, further coupled to an RMS converter, where the bandwidth of the converter is less than the spectrum of the measured input voltage signal.

Figure 1:
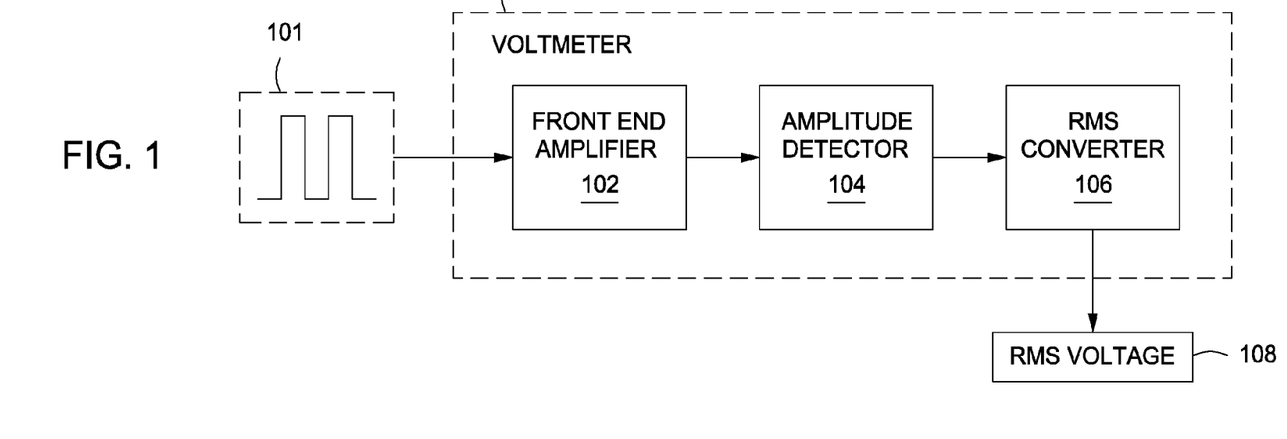
FIG. 1 is a block diagram of a measurement system in accordance with some embodiments of the present disclosure.

FIG. 1 is a block diagram of a measurement system 100 comprising a front-end amplifier 102, an amplitude detector 104, and an RMS converter 106. An input voltage signal 101 is measured by the front-end amplifier 102 of the measurement system 100. In some embodiments, the measurement system 100 may be a voltmeter, or the like. The measurement system 100 is designed to be used in service, installation, and maintenance environments in which a variety of input signals having a variety of wave shapes may be encountered. Skilled persons will recognize that the input signal source need not be a voltage source, but could be any signal source, for example, a current source, provided that the input signal is appropriately conditioned. The measurement system 100 may be implemented in the form of a digital multimeter, an oscilloscope, or other measurement instrument for measuring input signal voltages, for example in conjunction with commonly assigned pending U.S. patent application Ser. No. 12/708,648, filed on Feb. 19, 2010, and entitled "High Efficiency High Accuracy Heater Driver".

The front-end amplifier 102 converts amplitude of a measured voltage to a range acceptable to the RMS converter 106, where the RMS converter 106 has a bandwidth less than the spectrum of the measured signal. The RMS converter 106 can be a conventional, off-the-shelf standard RMS converter, whose bandwidth is usually limited, although other RMS converters may also be used. According to an exemplary embodiment, the front-end amplifier 102 is coupled to a lamp driver of a substrate processing chamber to measure RMS voltage of the lamp driver. The front-end amplifier 102 may have a non-uniform transfer function and may be coupled to contain over-voltage and over-current protection circuits, other amplifiers, attenuators, and filters in order to provide a scaled input signal of suitable amplitude level and bandwidth for conversion into digital samples.

Many commonly available and less expensive RMS converters have a limited bandwidth, or, restricted, bandwidth, i.e., approximately 100 kHz-500 kHz. However, such limited bandwidth RMS converters may only calculate RMS values for the portion of an input signal within the bandwidth of the RMS converter. It is impractical to use a high-bandwidth RMS converter in many instances because high-bandwidth RMS converters tend to be costly and difficult to integrate into commonly available RMS voltmeters. Accordingly, due to the bandwidth restriction of the RMS converter 106, a portion of the energy contained in the input voltage signal 101 will be ignored without the use of the amplitude detector 104.

The amplitude detector 104 transforms the spectrum of the input signal such that more of the spectrum falls within the bandwidth of the RMS converter 106. Specifically, the amplitude detector 104 outputs a signal having an amplitude equal to the amplitude of the signal input to the amplitude detector 104, but with a longer duration and a transformed spectrum. A larger portion of the energy of the signal is disposed in desired frequency regions of the output signal and a smaller portion of energy is disposed in other frequency regions of the output signal from the amplitude detector 104.

As used herein, desired frequency regions are frequency regions within the bandwidth of the RMS converter 106. Accordingly, in some embodiments, the transformed input signal has at least 10% of the energy of the signal transformed to within the desired frequency regions, or in some embodiments, at least 20%, or at least 30%, or at least 40%. In some embodiments a majority of the input voltage signal 101 has its energy transformed to within the desired frequency regions, such as at least 50%, or at least 60%, or at least 70%, or at least 80%, or at least 90%. In general, as more of the signal energy is transformed to be disposed within the desired frequency regions, the lower the RMS calculation error will be.

In some embodiments, the desired frequency regions are lower frequency regions, due to the bandwidth of the RMS converter. Lower frequency regions as used herein are identified relative to the entirety of the spectrum of the input voltage signal. For example, in some embodiments, a larger portion of the energy of the signal is disposed in lower frequency regions of the output signal, for example, less than 0.4 MHz, and a smaller portion of energy is disposed in higher-frequency regions of the output signal from the amplitude detector 104, for example, in the 0.4 MHz and greater range.

Figure 2:
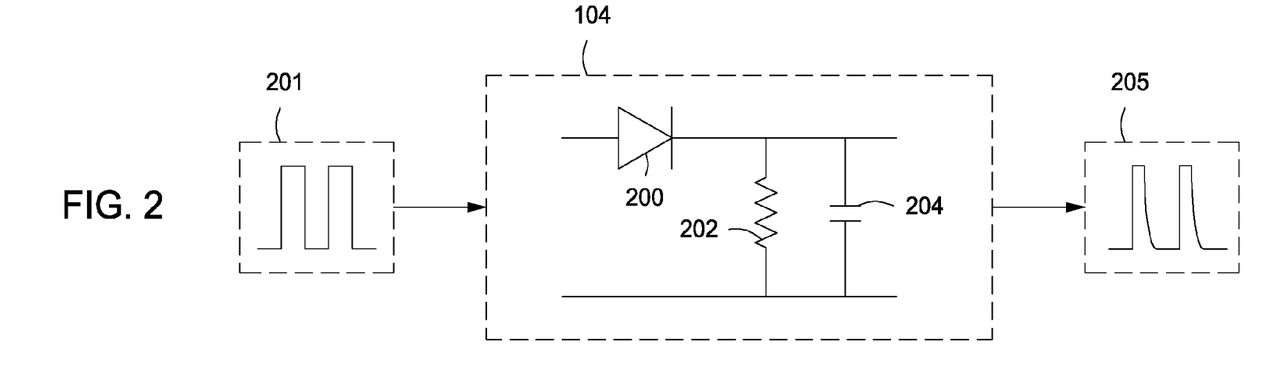
FIG. 2 is a circuit diagram of an amplitude detector in accordance with some embodiments of the present disclosure.

The amplitude detector 104 receives the input voltage signal 101 as a series of short width pulses which charge the capacitor 204. In exemplary embodiments, the lamp driver has a switching frequency of approximately 4.8 kHz. The duty cycle varies from 0.002 to 1 depending on the required RMS value of the output voltage.

The transformed signal is input to the RMS converter 106 which determines the RMS voltage value (i.e., RMS voltage 108) of the input voltage signal 101. In some embodiments, the RMS converter 106 can determine the RMS voltage value of the input voltage signal 101 with an error of approximately −10% to 2%, despite using the restricted, or low, bandwidth RMS converter 106. The bandwidth of the RMS converter 106 comprises at least the desired frequency regions of the transformed signal from the amplitude detector 104. The RMS converter 106 may have a larger frequency bandwidth or a different frequency bandwidth, such that the amplitude detector 104 must transform the input voltage signal to the desired frequency bandwidth in order to calculate RMS with an acceptable error rate. For example, the amplitude detector 104 may be configured to target a higher frequency region because the RMS converter 106 is configured to perform RMS calculations at a higher bandwidth frequency. Custom RMS converters with varying bandwidths may be used in conjunction with the present disclosure, and amplitude detectors for targeting those bandwidths can be selected accordingly.

Figure 3:
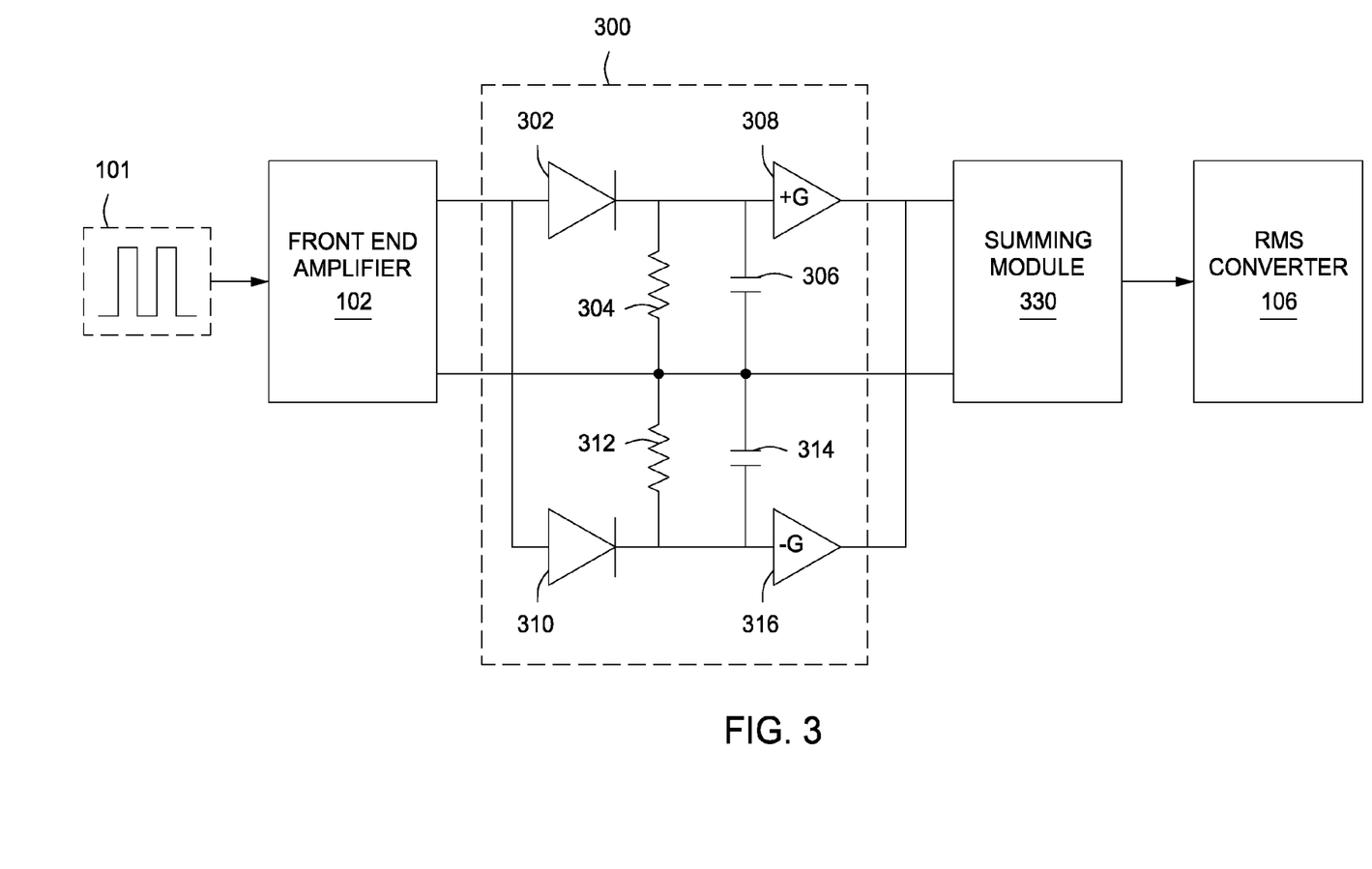
FIG. 3 is a circuit diagram of a bipolar amplitude detector in accordance with some embodiments of the present disclosure.

In instances where peak voltage is low and forward voltage drop of a diode is typically 0.6 V, the RMS calculation error may be unacceptably large. To compensate for RMS error, the amplitude detector 104 can be modified as depicted in FIG. 3.

According to exemplary embodiments, the measuring system 100 may be coupled to the output voltage of a lamp driver, for example, a lamp driver in a rapid thermal processing (RTP) tool, chemical vapor deposition (CVD) tool, the Linear Technology Chip LTC1968, or the like, for driving a lamp circuit in a substrate process chamber, as described in further detail below with respect to FIG. 4. The computed RMS value is generally used to control or maintain the lamp driver output voltage when the LTC1968 is controlling open loop temperature.

FIG. 2 is a circuit diagram of the amplitude detector 104 according to exemplary embodiments of the present disclosure. The amplitude detector 104 comprises a diode 200, coupled to a resistor 202 and a capacitor 204. The diode 200 and the resistor 202 form a half-wave rectifier. The half-wave rectifier and the capacitor 204 are coupled in parallel according to an exemplary embodiment. Signal 201 is the output voltage signal from the front-end amplifier 102. During the positive portion of the input signal cycle, the diode is forward biased, and the full applied voltage is dropped across resistor 202; the pulsed signal 201 charges the capacitor 204. During the negative portion of the input signal cycle, the diode is reverse biased and acts like an open circuit, where no voltage is present across resistor 202, and the stored energy in the capacitor 204 is slowly discharged to produce output signal 205. In cases where the voltage of the input voltage signal 101 is significantly small, such as approximately 5 V or lower, for example, the voltage drop across the diode will be very significant, possibly up to 10% of the signal, and therefore other embodiments of the amplitude detector are used, as shown in FIG. 3.

Figure 6A:
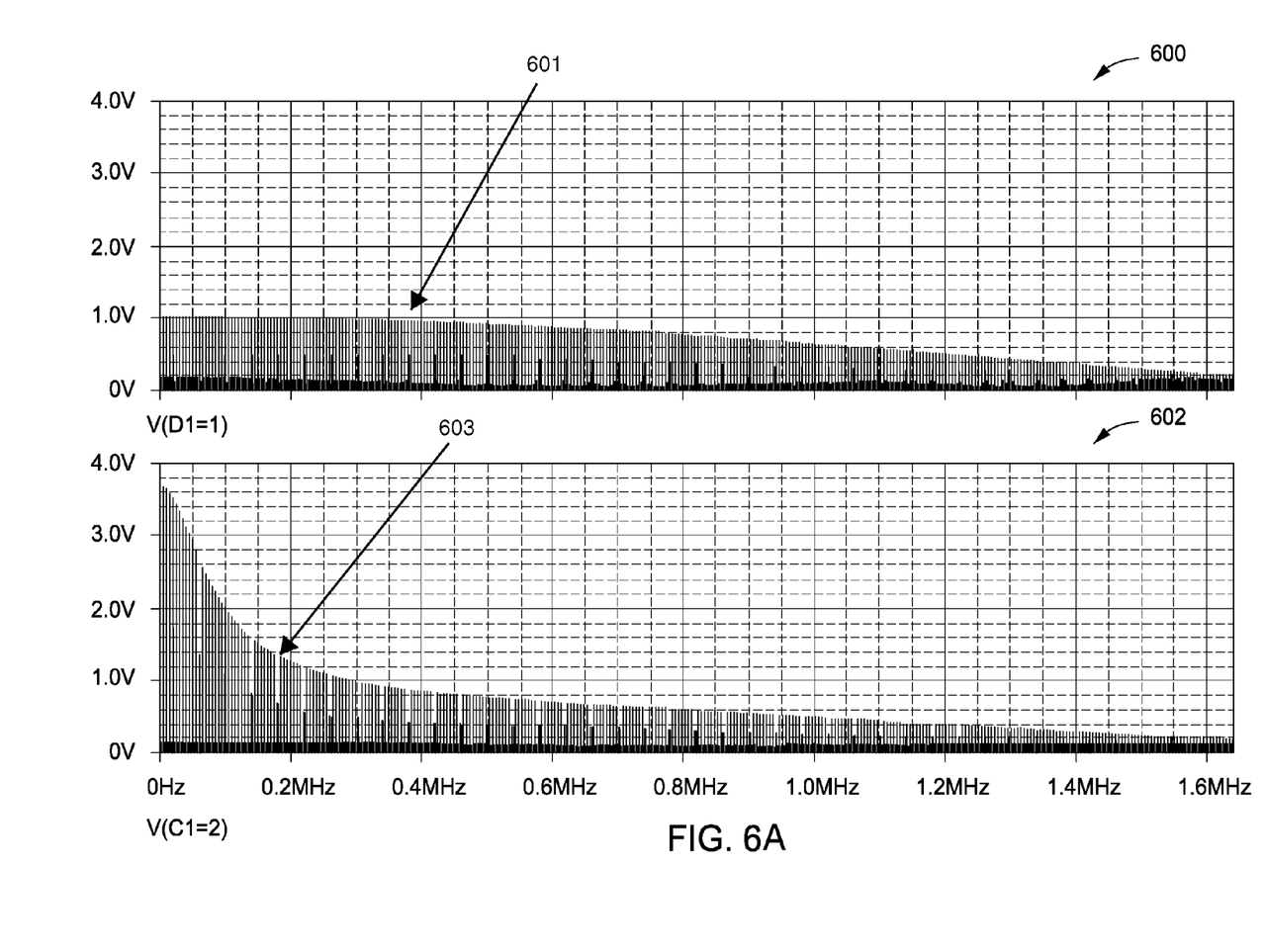
FIG. 6A is an illustration of an original source input voltage signal and a transformed output signal in accordance with some embodiments of the present disclosure.
Figure 6B:
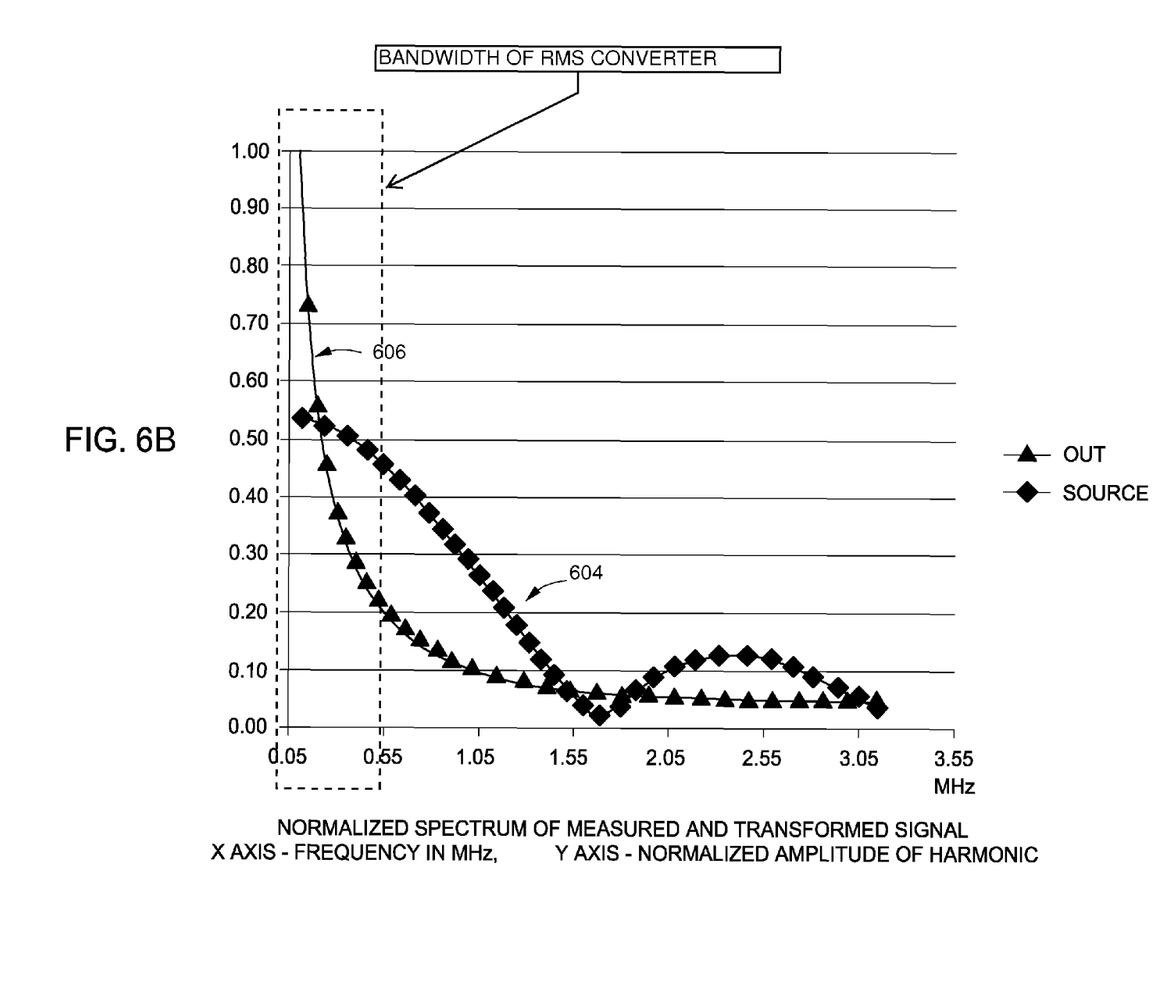
FIG. 6B is an illustration of a normalized spectrum of an original source input voltage signal and a transformed output signal in accordance with some embodiments of the present disclosure.

Accordingly, the amplitude detector 104 outputs an output signal 205, having amplitude equal to the amplitude of the input voltage signal 101 input into the amplitude detector 104, but with a transformed spectrum as shown in FIGS. 6A and 6B. FIG. 6A depicts a source signal graph 600 including the source signal 601 representing the spectrum of the original source input voltage signal (i.e., the source signal) from the front-end amplifier 102, where there is a wide spectrum of high amplitude pulses. FIG. 6A further depicts an output signal graph 602 including an output signal 603 representing the spectrum of the signal output from the amplitude detector 104, where the high frequency components have lower amplitude, and the low frequency components have higher amplitude, i.e., the spectrum of the signal has shifted to a lower frequency region, causing the bandwidth of the RMS converter 106 to produce more accurate RMS values for the input voltage signal because of the low-bandwidth of the RMS converter 106. That is, more energy is focused in the low frequency region of output signal 603. For example, the source signal graph 600 depicts the source signal 601 maintaining an average voltage of approximately 0.5 V, and an average RMS value of 1.0 V in the 0 Hz range to the 1.0 MHz range. However, in the output signal graph 602, a larger portion of the signal 603 is now located in the 0.4 MHz frequency region or below. This can be demonstrated by performing an integral over frequency of the signal 601 and the signal 603 to calculate the energy in each signal. The result of both integrals should be approximately equal in value indicating that very little energy is lost from the original input voltage signal 101.

FIG. 6B depicts an example of a normalized spectrum of a measured source input signal 604 and a transformed output signal 606. As shown in FIG. 6B, in the bandwidth of the RMS converter, the high frequency components of the transformed output signal 606 have lower amplitude than the input source signal 604, and the low frequency components of the transformed output signal 606 have higher amplitude than the input source signal 604.

Table 1 below shoes an exemplary output of an RTP lamp driver in accordance with some embodiments of the present disclosure. The input voltage signal has an exemplary amplitude of 200 V, an exemplary pulse width from about 0.5 to about 64 microseconds, an exemplary period of about 200 microseconds, and an exemplary switching frequency of about 5 kHz. The switching frequency defined by the lamp driver requirement and design is selected as 4.8 kHz. The present embodiment may also be applied to other pulse with modulated (PWM) signals for example in motor drivers. The values of resistors and capacitors depend on the parameters of the measured signal from such drivers. For example, resistors in many motor drivers range from approximately 10 kΩ to 30 kΩ and capacitors are range from approximately 100 pF to 200 pf, according to exemplary embodiments. In one embodiment, the resistor 202 is a 20 kΩ resistor and the capacitor 204 is a 130 pF capacitor. According to exemplary embodiments, the resistor 202 and the capacitor 204 are selected to improve accuracy of the measurement of the RMS converter 106, where in this embodiment the RMS converter 106 has a bandwidth of 100 kHz. As can be seen from the results shown in Table 1, the error in the calculated RMS voltage using embodiments of the present disclosure is greatly reduced as compared to standard measurement techniques.

TABLE 1

| Actual RMS Voltage (V) | Crest Factor of Output Voltage | Error with Standard Measurement | Error With Amplitude Detector |
| --- | --- | --- | --- |
| 14 | 13.9 | −45.6% | −6.7% |
| 20 | 9.9 | −25.9% | −4.8% |
| 30 | 7.0 | −7.0% | 1.3% |

FIG. 3 is a circuit diagram of the amplitude detector 104 according to some embodiments of the present disclosure. FIG. 3 illustrates an amplitude detector 300 for a bipolar voltage input. For example, if input voltage signal 101 is generated by a bipolar power supply, the amplitude detector 300 will be used in place of amplitude detector 104 in FIG. 2.

The amplitude detector 300 comprises a first circuit branch (positive polarity section) and a second circuit branch (negative polarity section). The positive polarity section for transforming the positive portion of the signal from the front-end amplifier 102 comprises a diode 302, a first resistor 304, a first capacitor 306 and a first amplifier 308. In FIG. 3, the diode 302 rectifies the positive portion of the input signal. Diode 310 rectifies the negative portion of the input signal. An inverter may be used to invert the polarity of the measured negative signal. The amplitude detector 300 further includes a negative polarity section for transforming the negative portion of the signal from the front-end amplifier 102, the negative polarity section including the diode 310, a second resister 312, a second capacitor 314 and a second amplifier 316. In some embodiments, the second amplifier 316 may also function as the inverter discussed above. The summing module 330 sums the two signals and couples the sum to the RMS converter 106. According to some embodiments of the present disclosure, the module 330 is, for example, an operation amplifier for summing two signals together.

Figure 4:
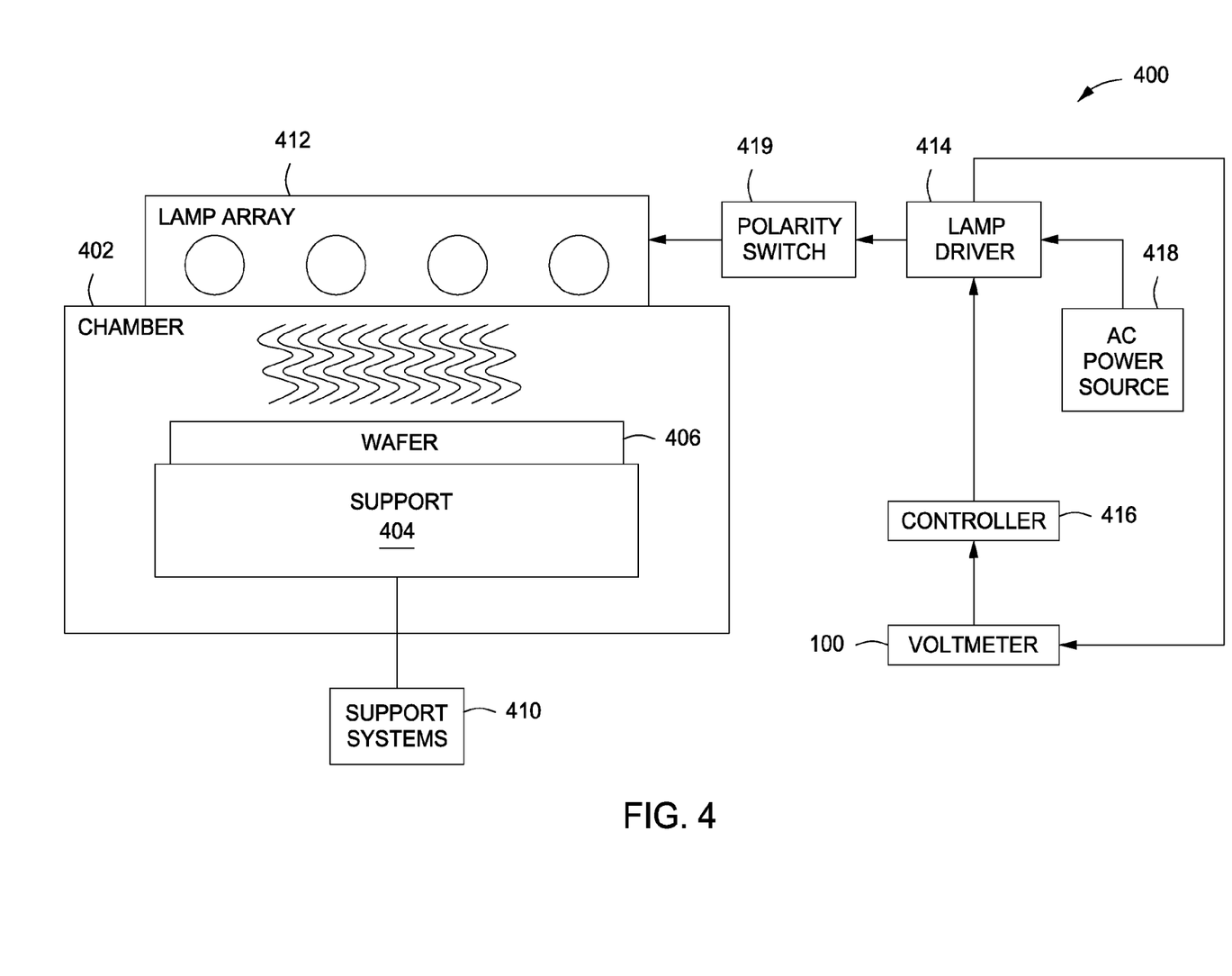
FIG. 4 depicts a block diagram of a substrate processing apparatus in accordance with embodiments of the present disclosure.

FIG. 4 depicts a block diagram of a substrate processing apparatus 400 in accordance with embodiments of the present disclosure. Although the specific configuration of the substrate processing apparatus 400 shown in FIG. 1 is suitable for RTP, it is contemplated that the substrate processing apparatus 400 may be configured for epitaxial deposition or other thermal substrate processes. As depicted in FIG. 4, the substrate processing apparatus 400 comprises a chamber 402, a support 404 for a substrate 406, support systems 410, lamp array 412, lamp driver 414, controller 416, an AC power source 418 and, optionally, a polarity switch 419. The substrate 406 is, for example, a semiconductor wafer. The support 404 holds the substrate 406 so that it may be thermally processed in the chamber 402. The support systems 410 control the support and allow for adjustment of the support 404 position, and in turn, the position of the substrate 406.

The AC power source 418 delivers AC power to the lamp driver 414. The AC power may have one or more phases, and in some embodiments, has three phases. In some embodiments, the AC power source delivers 480 V to the lamp driver 414. The controller 416 controls the operation of the lamp driver 414. The lamp driver 414 transforms the AC power to DC power and steps down the DC power voltage. The lamp driver 414 distributes the stepped-down power to the lamp array 412. In turn, the lamp array 412 produces heat to thermally process the substrate 406 within the chamber 402. In some embodiments, the lamp array 412 comprises several about 80 V to about 120 V, such as about 100 V, lamps, such as halogen lamps, and the stepped-down voltage is 200 V. In other embodiments, other types of lamps with different power constraints may be used, such as incandescent lamps having other voltage ratings, or the like.

The polarity switch 419, when present, is coupled to the lamp driver 414 and the lamp array 412, and allows for toggling the polarity of the circuit. According to some embodiments, the polarity switch 419 reverses the polarity of the substrate processing apparatus 400 for every n wafers transferred into the chamber 402, where n=1 to about 100 wafers. For example, the polarity may be reversed after every wafer, or after a number of wafers in a single cassette (for example about 25), or greater numbers, such as after processing about 100 wafers. Switching the polarity of the circuit may facilitate mitigating DC notching, or faceting, of the filament of the lamp, which would lead to failure of the lamp.

According to some embodiments of the present disclosure, the lamp driver 414 outputs voltage to the measurement system 100 (e.g., a voltmeter) to provide diagnostics and control to the controller 416. The controller 416 can use the RMS calculations provided by the measurement system 100 to modify the operation of the lamp driver 414.

Figure 5:
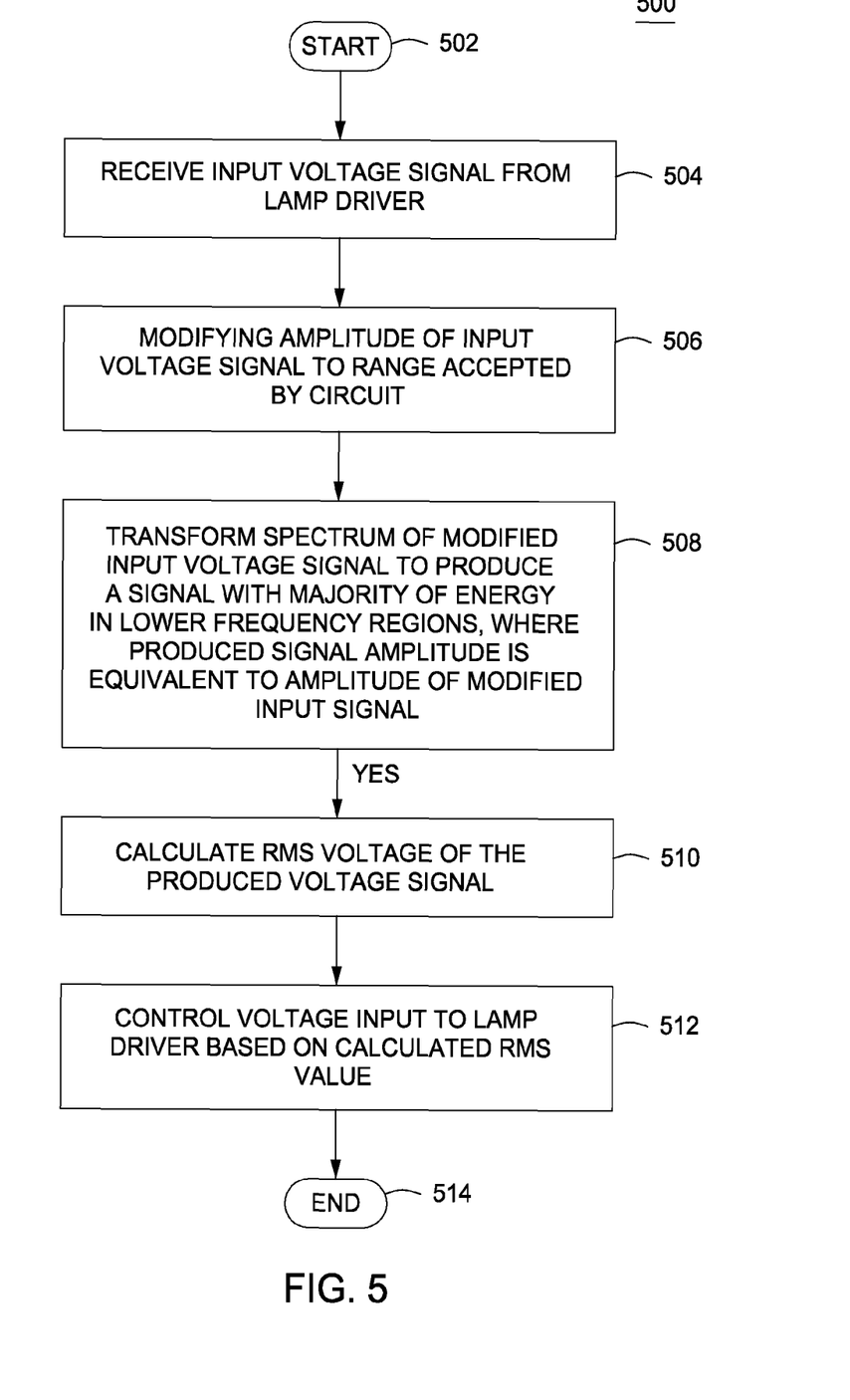
FIG. 5 is a flow diagram depicting a method for determining RMS voltage in accordance with exemplary embodiments of the present disclosure.

FIG. 5 is a flow diagram depicting a method 500 for determining RMS voltage in accordance with exemplary embodiments of the present disclosure. The method begins at 502 and proceeds to 504. At 504, an input voltage signal is received. According to an exemplary embodiment, the voltage signal is from a lamp driver for driving a lamp circuit in a substrate process chamber. At 506, the amplitude of the input voltage signal is converted by the front-end amplifier 102, shown in FIG. 1, to an amplitude in the range accepted by the RMS converter 106 in FIG. 1.

At 508, amplitude detector 104 transforms the spectrum of the modified input voltage signal to produce a signal with at least some energy, or in some embodiments, the majority of the energy, located in desired frequency regions (for example, lower frequency regions, or about 0.4 MHz and below) as compared to other frequency regions (for example, higher frequency regions, or greater than about 0.4 MHz). The amplitude of the transformed signal is substantially equivalent to the amplitude of the signal input to the amplitude detector 104.

At 510, the RMS voltage of the transformed spectrum signal (for example, the transformed signal 602 depicted in FIG. 6) is calculated by the RMS converter 106. As described above, since the majority of energy in the signal is located in desired frequency regions of the transformed spectrum signal corresponding to the bandwidth of the RMS converter, the low bandwidth RMS converter 106 is able to calculate RMS using the majority of energy in the signal, resulting in a lower error, for example, in some embodiments, approximately equal to 10%. The RMS calculation may then be used for diagnostics and to control the voltage input to the lamp driver, using the controller 416 at step 512. The method then terminates at 514.

While the foregoing is directed to embodiments of the present disclosure, other and further embodiments of the disclosure may be devised without departing from the basic scope thereof.

The invention claimed is:

1. An apparatus for determining a root-mean-square (RMS) voltage of an input voltage signal, comprising:
    an amplifier to modify an amplitude of an input voltage signal, wherein the input voltage signal is a pulse width modulated signal supplied to a lamp driver;
    an amplitude detector, coupled to the amplifier, that outputs a normalized signal having an amplitude equal to an amplitude of the input voltage signal, with a longer duration of time than the input voltage signal; and
    a root-mean-square (RMS) converter, coupled to the amplitude detector, to determine the RMS voltage of the input voltage signal over the longer duration of time, wherein a bandwidth of the RMS converter includes a desired frequency region, and wherein the bandwidth of the RMS converter is smaller than a frequency range of the input voltage signal and larger than a frequency range of the normalized signal such that RMS voltage calculation error is reduced.

2. The apparatus of claim 1, wherein the amplitude detector comprises:
    a diode, coupled in series with a resistor, to pulse the modified input voltage signal; and
    a capacitor, coupled in parallel to the resistor and the diode, to smooth the pulsed modified input voltage signal.

3. The apparatus of claim 2, wherein the resistor has a resistance ranging in value from approximately 10 kΩ to 30 kΩ and the capacitor has an approximate capacitance of 100 pF to 200 pF.

4. The apparatus of claim 1, further comprising:
a lamp driver, wherein the input voltage is from the lamp driver to control a lamp circuit of a substrate process chamber.

5. The apparatus of claim 4, wherein the lamp driver has a pulse width modulated signal.

6. The apparatus of claim 1, wherein the normalized signal comprises a greater amount of signal energy in lower frequency regions than the amount of signal energy in higher frequency regions.

7. The apparatus of claim 1, wherein the amplitude detector comprises:
a first circuit branch to transform a positive portion of the input voltage signal; and
a second circuit branch to transform a negative portion of the input voltage signal,
wherein the apparatus further comprises a summing module to sum positive portion of the input voltage signal from the first circuit branch and the negative portion of the input voltage signal from the second circuit branch.

8. The apparatus of claim 7, wherein the first and second circuit branch both comprise:
a diode coupled to a resistor;
a capacitor coupled in parallel to the resistor; and
an amplifier coupled to the capacitor.

9. The apparatus of claim 8, further comprising:
a lamp driver, wherein the input voltage signal is from the lamp driver to control a lamp circuit of a substrate process chamber and the RMS voltage controls operation of the lamp driver.

10. The apparatus of claim 9, wherein the lamp driver generates a pulse width modulated signal.

11. A method for determining a root-mean-square (RMS) voltage of an input voltage signal, comprising:
modifying, using an amplifier, an amplitude of the input voltage signal, wherein the input voltage signal is a pulse width modulated signal supplied to a lamp driver;
normalizing a spectrum of the modified input voltage signal to generate a normalized signal with an amplitude equal to an amplitude of the input voltage signal and a longer duration of time than the input voltage signal; and
determining, using an RMS converter, the RMS voltage of the input voltage signal over the longer duration of time, wherein a bandwidth of the RMS converter includes a desired frequency region, and wherein the bandwidth of the RMS converter is smaller than a frequency range of the input voltage signal, but larger than a frequency range of the normalized signal such that RMS voltage calculation error is reduced.

12. The method of claim 11, further comprising:
pulsing the modified input voltage signal; and
smoothing the pulsed modified input voltage signal prior to transforming the spectrum of the modified input voltage signal.

13. The method of claim 12, further comprising:
pulsing the modified input voltage signal using a diode coupled to a resistor; and
smoothing the pulsed modified input voltage signal using a capacitor coupled in parallel to the resistor and the diode.

14. The method of claim 11, further comprising providing the input voltage signal from a lamp driver for controlling a lamp circuit of a substrate process chamber.

15. The method of claim 14, wherein the lamp driver has a pulse width modulated signal.

16. The method of claim 11, wherein normalized signal comprises a greater amount of signal energy in lower frequency regions than the amount of signal energy in higher frequency regions.

17. The method of claim 11, wherein transforming the spectrum of the modified input voltage signal includes:
transforming a positive portion of the input voltage signal using a first circuit branch of an amplitude detector;
transforming a negative portion of the input voltage signal using a second circuit branch of an amplitude detector; and
summing the transformed positive portion of the input voltage signal and the transformed negative portion of the input voltage signal.

18. The method of claim 17, wherein the first and second circuit branch both comprise:
a diode coupled to a resistor;
a capacitor coupled in parallel to the resistor; and
an amplifier coupled to the capacitor.

19. The method of claim 18, further comprising:
controlling a lamp driver using the RMS voltage, wherein the lamp driver controls a lamp circuit of a substrate process chamber.

20. A substrate processing apparatus, comprising:
a process chamber;
a lamp array configured to provide heat to the process chamber to process substrates when disposed therein;
a lamp driver that delivers stepped-down power to the lamp array as a pulse width modulated input voltage signal;
a power source electrically coupled to the lamp driver to deliver power to the lamp driver;
a controller communicatively coupled to the lamp driver to control operation of the lamp driver; and
a measuring system coupled to an output voltage of the lamp driver and configured to provide root-mean-square (RMS) voltage information to the controller to control the lamp driver, the measuring system comprising:
an amplifier to modify an amplitude of the input voltage signal provided by the lamp driver;
an amplitude detector, coupled to the amplifier, that outputs a normalized signal having an amplitude equal to an amplitude of the input voltage signal, with a longer duration of time than the input voltage signal; and
a root-mean-square (RMS) converter, coupled to the amplitude detector, to determine the RMS voltage of the input voltage signal over the longer duration of time, wherein a bandwidth of the RMS converter includes a desired frequency region, and wherein the bandwidth of the RMS converter is smaller than a frequency range of the input voltage signal and larger than a frequency range of the normalized signal such that RMS voltage calculation error is reduced.

* * * * *